(12) United States Patent
Polly et al.

(10) Patent No.: US 10,627,988 B2
(45) Date of Patent: Apr. 21, 2020

(54) VISUALLY IDENTIFIABLE FEATURES FOR APPLICATIONS INSTALLED ON ELECTRONIC DEVICES

(71) Applicant: Keithley Instruments, LLC, Solon, OH (US)

(72) Inventors: George J. Polly, Brecksville, OH (US); Brian P. Frackelton, Macedonia, OH (US)

(73) Assignee: Keithley Instruments, LLC, Solon, OH (US)

( * ) Notice: Subject to any disclaimer, the term of this patent is extended or adjusted under 35 U.S.C. 154(b) by 256 days.

(21) Appl. No.: 15/395,812

(22) Filed: Dec. 30, 2016

(65) Prior Publication Data

US 2017/0205988 A1    Jul. 20, 2017

Related U.S. Application Data

(60) Provisional application No. 62/278,791, filed on Jan. 14, 2016.

(51) Int. Cl.
*G06F 3/048* (2013.01)
*G06F 3/0481* (2013.01)
*G05B 19/042* (2006.01)
*G01R 1/02* (2006.01)

(52) U.S. Cl.
CPC ......... *G06F 3/04817* (2013.01); *G01R 1/025* (2013.01); *G05B 19/0423* (2013.01); *G05B 2219/23258* (2013.01)

(58) Field of Classification Search
CPC ............... G01R 1/025; G05B 19/0423; G05B 2219/23258
See application file for complete search history.

(56) References Cited

U.S. PATENT DOCUMENTS

| | | | | |
|---|---|---|---|---|
| 6,886,135 | B2* | 4/2005 | Fernandez | G06F 9/451 715/762 |
| 7,613,957 | B2* | 11/2009 | Cummins | G06F 11/321 714/48 |
| 7,694,229 | B2* | 4/2010 | Stoakley | G06F 9/451 715/762 |
| 8,698,835 | B1* | 4/2014 | Shiplacoff | G06T 11/001 345/589 |
| 2002/0149629 | A1* | 10/2002 | Craycroft | G06F 9/451 715/861 |
| 2008/0278143 | A1* | 11/2008 | Cox | G01R 13/02 324/121 R |
| 2010/0088367 | A1* | 4/2010 | Brown | G06F 8/60 709/203 |
| 2011/0252344 | A1* | 10/2011 | van Os | G06F 9/451 715/763 |

(Continued)

*Primary Examiner* — Mahelet Shiberou
(74) *Attorney, Agent, or Firm* — Miller Nash Graham & Dunn; Andrew J. Harrington (57) ABSTRACT

An electronic device for running an application can include a display to visually present a user interface corresponding to the application. The electronic device can also include a processor to determine whether the application is an originally-installed application and cause the display to include a visually identifiable feature in the user interface indicating that the application is not an originally-installed application responsive to a determination that the application is not an originally-installed application.

17 Claims, 6 Drawing Sheets

(56) References Cited

U.S. PATENT DOCUMENTS

| | | | |
|---|---|---|---|
| 2011/0252346 A1* | 10/2011 | Chaudhri | G06F 3/04817 715/765 |
| 2012/0072871 A1* | 3/2012 | Seo | H04N 5/445 715/838 |
| 2012/0166979 A1* | 6/2012 | Lewontin | G06F 8/38 715/762 |
| 2012/0200586 A1* | 8/2012 | Lima | G06F 9/451 345/582 |
| 2015/0121083 A1* | 4/2015 | Zhang | G06F 8/61 713/176 |
| 2015/0149939 A1* | 5/2015 | Mayblum | H04M 1/72544 715/765 |

* cited by examiner

VISUALLY IDENTIFIABLE FEATURES FOR APPLICATIONS INSTALLED ON ELECTRONIC DEVICES

CROSS-REFERENCE TO RELATED APPLICATION

This application claims the benefit of U.S. Provisional Application Ser. No. 62/278,791, titled "DYNAMICALLY COLORED SCREEN TITLE BAR" and filed on Jan. 14, 2016, the content of which is hereby fully incorporated by reference herein.

TECHNICAL FIELD

Embodiments of the disclosed technology generally relate to electrical test instrumentation and, in particular, to digital multi-meters (DMMs), power supplies, and source measure units (SMUs).

BACKGROUND

Traditionally, electrical test and measurement instruments have fixed user interface (UI) content developed by the manufacturer of the device. More recently, third parties have been able to develop UI content that differs from the originally installed content. This content may be distributed openly over the Internet as a script, for example. However, there are no means for the end user and/or the company that built the device to be able to quickly distinguish UI content based on the source of the content.

Some test and measurement instruments implement a special user screen that allows only two user-controlled text lines, but the UI is unable to support customizations. Some devices (such as the DMM7510, 2450, 2460, and 2461 by Keithley Instruments) have a graphical touch screen, but these devices can still only support primitive customization via two lines of text, which undesirably limits the ability to customize the device in a general way with significant derived value.

While some Windows-based devices allow for more dynamic applications, such devices are not configured to visually differentiate originally installed applications from third-party-developed applications. Indeed, everyday devices such as personal computers (PCs), laptops, tablets, and smartphones draw no distinction between factory-supplied applications and third-party applications.

Thus, there is a fundamental need to balance quality control and speed to realize an effective solution.

Some current attempts focus on quality control and require all applications to be approved before they can be deployed. Applications must comply with written standards and be tested before they can be distributed to end customers (e.g., by way of an application store) and installed on pertinent devices. While such attempts can result in good quality control, the speed and efficiency are both poor. For example, it may take several weeks for a company to review and approve a submitted application because such review is a manual and subjective process. It is difficult—if not impossible—to install such applications without approval because of intentionally manual steps, a limited number of possible target devices, and detailed information requirement about those devices, for example. Also, there is no distinction between "ad hoc" installed devices for development and those that were installed officially, e.g., by way of an application store.

Other current attempts do not require approval. For example, an application can be available for installation within minutes of submission. Such attempts leave it up to the application developer to manage quality control and, while they are superior from a customer point of view, the reduced—if not eliminated—quality controls can cause problems. In fact, technicians may need to literally fly around the world to troubleshoot problems. This is because certain devices cannot be investigated remotely since such devices are used individually and independent of any network. That is, they are not integrated in a system so the only way a technician can troubleshoot the device is to do so in person.

Thus, there is a need for a user to be able to distinguish the source of applications installed on certain test and measurement instruments.

DETAILED DESCRIPTION

Implementations of the disclosed technology provide a user of an electronic device with the ability to clearly distinguish manufacturer-supplied and/or manufacturer-installed firmware and/or applications from third-party applications installed on a test and measurement instrument. Such implementations may include multiple tiers. One tier may include production firmware, which generally includes screens that are native to the test and measurement instrument and are part of the device's core firmware and generally cannot be installed or uninstalled by an end user. The manufacturer of the electronic device may include such firmware and/or applications as part of the instrument, for example. These are typically factory-installed and factory-supported.

Another tier may include endorsed applications, e.g., manufacturer-approved applications that are installable and removable by end users of the instrument. Such applications generally execute on top of the device firmware and may customize the user interface (UI) to include new screens and content. These applications may be developed by the device manufacturer or one of several different types of third parties that may include customers or system integrators, for example. Third-party applications are generally not reviewed by the device manufacturer and, as such, the device manufacturer cannot endorse the quality of such applications. General purpose instrumentation, such as a digital multi-meter (DMM), can allow for customized scripts and/or applications.

Figure 1:
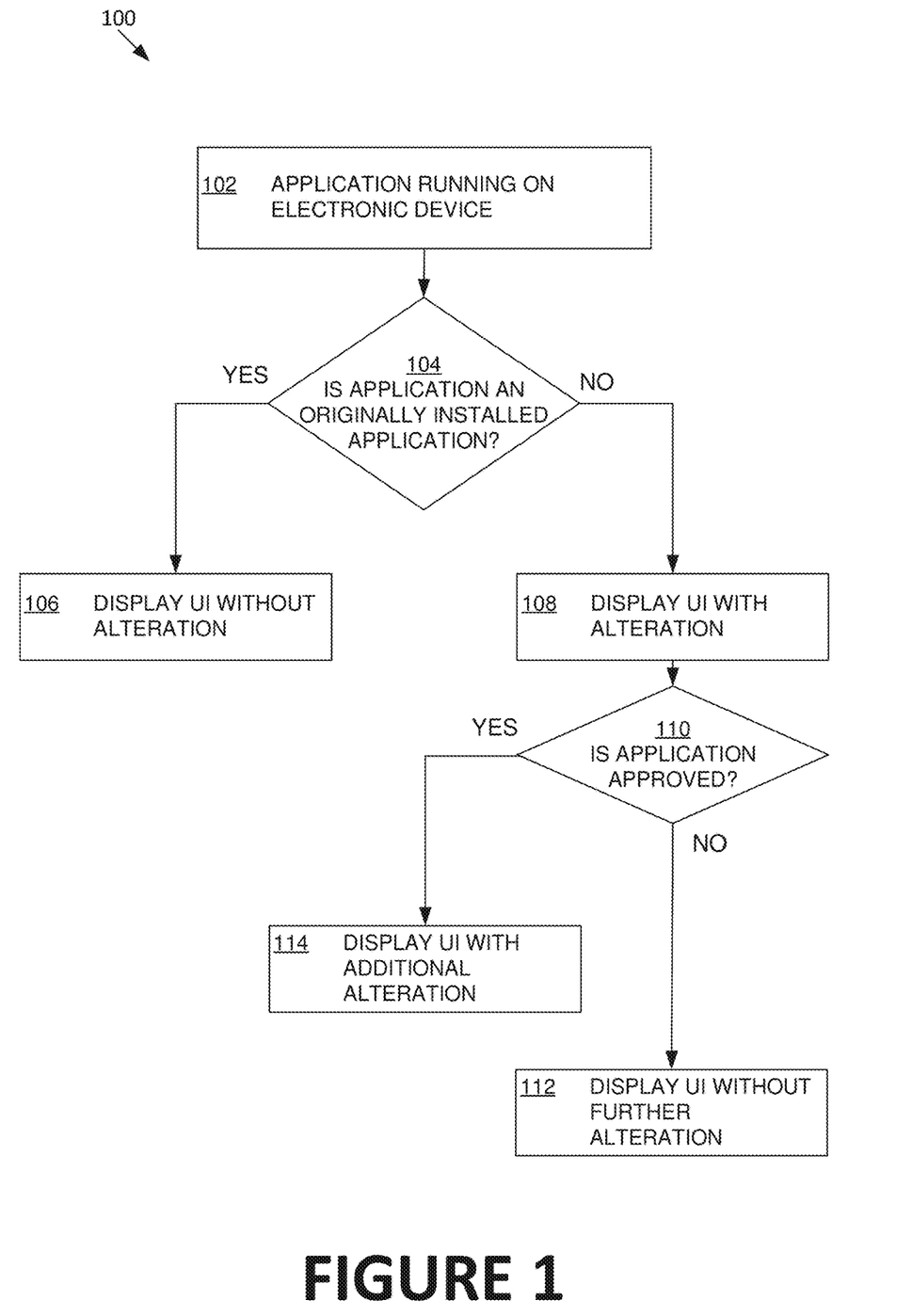
FIG. 1 is a flow diagram illustrating an example of a method for an electronic device, such as a test and measurement instrument, in accordance with certain implementations of the disclosed technology.

FIG. 1 is a flow diagram illustrating an example of a method 100 in accordance with certain implementations of the disclosed technology. At 102, an application is running on an electronic device such as a test and measurement instrument, for example. The electronic device may include a display device, such as a screen, and a processor, for example.

At 104, a determination is made as to whether the application is an originally-installed application such as factory-installed firmware, for example. Such determination may be made by the processor. If the determination is that the application is an originally-installed application, the method 100 proceeds to 106. If the determination is that the application is not an originally-installed application, however, the method 100 proceeds to 108.

At 106, the electronic device presents the user interface (UI), e.g., the main screen including a title bar of the running application, without any alteration.

At 108, the electronic device alters the UI such that it includes a visually identifiable feature corresponding to the application. The visually identifiable feature can include a different color of the application title bar and/or other portion of the UI, different colors of the background text and/or foreground, different font styles and/or colors, placement of a different icon and/or distinguishing wording or visual mark, or any combination thereof. In certain implementations, a light-emitting diode (LED) or other physical component, e.g., on the front panel of the electronic device, may be used in addition to or in place of one or more other visually identifiable features to indicate, e.g., to a user and/or a technician, that the running application is not an originally-installed application.

At 110, a determination is made as to whether the application is an approved application, e.g., endorsed and/or sanctioned by the manufacturer of the device. Such determination may be made by the processor. If the determination is that the application is an approved application, the method 100 proceeds to 114. If the determination is that the application is not an approved application, however, the method 100 proceeds to 112.

At 112, the electronic device presents the UI without any further alteration. That is, the UI is maintained with no change to the existing visually identifiable feature and no additional visually identifiable features.

At 114, the electronic device alters the UI such that it includes another visually identifiable feature corresponding to the application. This additional visually identifiable feature indicates that the later-installed application is approved and can include a different color of the application title bar and/or other portion of the UI, different colors of the background text and/or foreground, different font styles and/or colors, placement of a different icon and/or distinguishing wording or visual mark, a physical component such as an LED, or any combination thereof.

In certain implementations, any visually identifiable feature(s) may be displayed during the entire execution of the application, e.g., so that the corresponding designation of the application is made known to a user of the electronic device throughout execution of the application. In alternative implementations, any visually identifiable feature(s) may be displayed only at certain designated times, e.g., during an installation or startup of the device.

In alternative implementations, 112 and 114 may effectively switch positions such that, responsive to a determination at 110 that the later-installed application is not approved, the additional visually identifiable feature is used to indicate such status.

Figure 2:
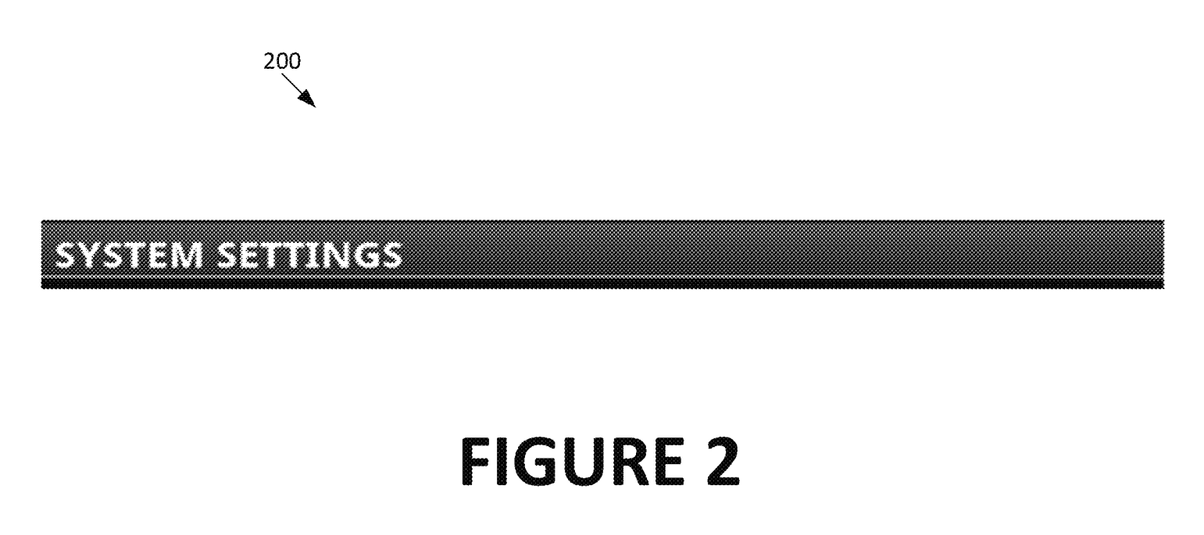
FIG. 2 illustrates an example of a title bar for a user interface corresponding to an originally-installed application, such as firmware, running on an electronic device in accordance with certain implementations of the disclosed technology.

FIG. 2 illustrates an example of a title bar 200 for a user interface corresponding to an originally-installed application, such as factory-installed firmware, running on an electronic device in accordance with certain implementations of the disclosed technology. In the example, the application title bar 200 has a blue background to indicate that the application is an originally-installed application such as production firmware, for example.

Figure 3:
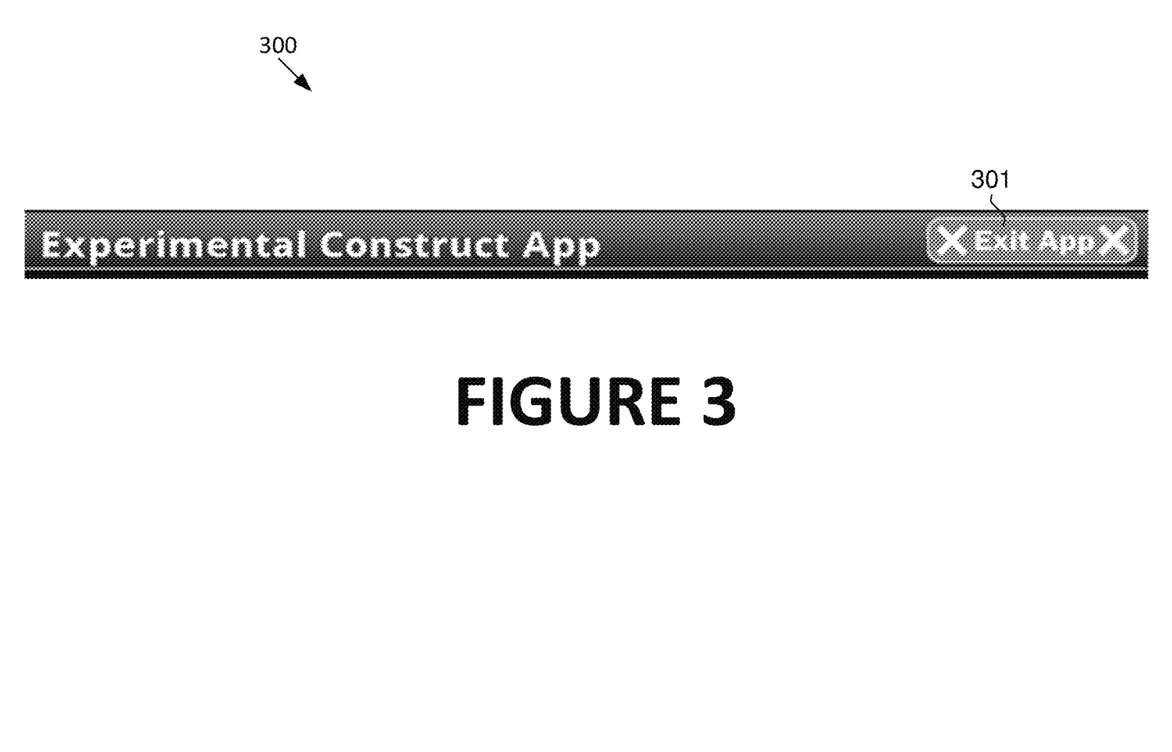
FIG. 3 illustrates an example of a title bar for a user interface corresponding to an application running on an electronic device that is not an originally-installed application in accordance with certain implementations of the disclosed technology.

FIG. 3 illustrates an example of a title bar 300 for a user interface corresponding to an application running on an electronic device that is not an originally-installed application in accordance with certain implementations of the disclosed technology. In the example, the title bar 300 has an orange background to indicate that the application is not an originally-installed application. In certain implementations, an additional visually identifiable feature may be included. In the example, the title bar 300 also includes an Exit App or End App icon 301, e.g., to enable the user and/or technician to quickly and easily cause the application to stop running to diagnose the device, for example.

Figure 4:
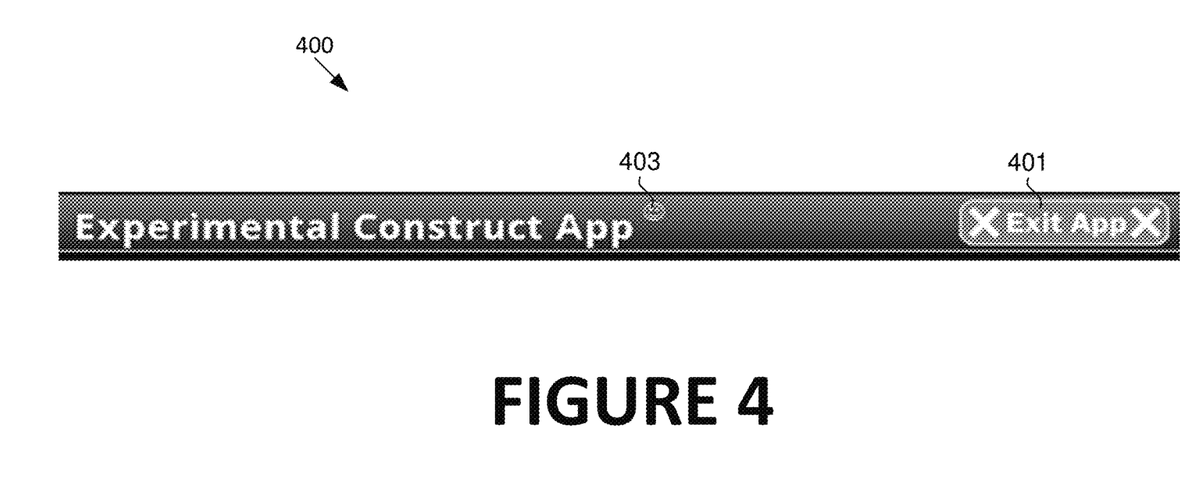
FIG. 4 illustrates an example of a title bar for a user interface corresponding to an application running on an electronic device that is a later-installed and approved application in accordance with certain implementations of the disclosed technology.

FIG. 4 illustrates an example of a title bar 400 for a user interface corresponding to an application running on an electronic device that is a later-installed and approved application in accordance with certain implementations of the disclosed technology. In the example, the title bar 400 has an orange background to indicate that the application is not an originally-installed application and an additional visually identifiable feature 403, such as an icon, to indicate that the later-installed application is approved. In certain implementations, another visually identifiable feature may be included. In the example, the title bar 400 also includes an Exit App or End App icon 401, e.g., to enable the user and/or technician to quickly and easily cause the application to stop running to diagnose the device, for example.

Figure 5:
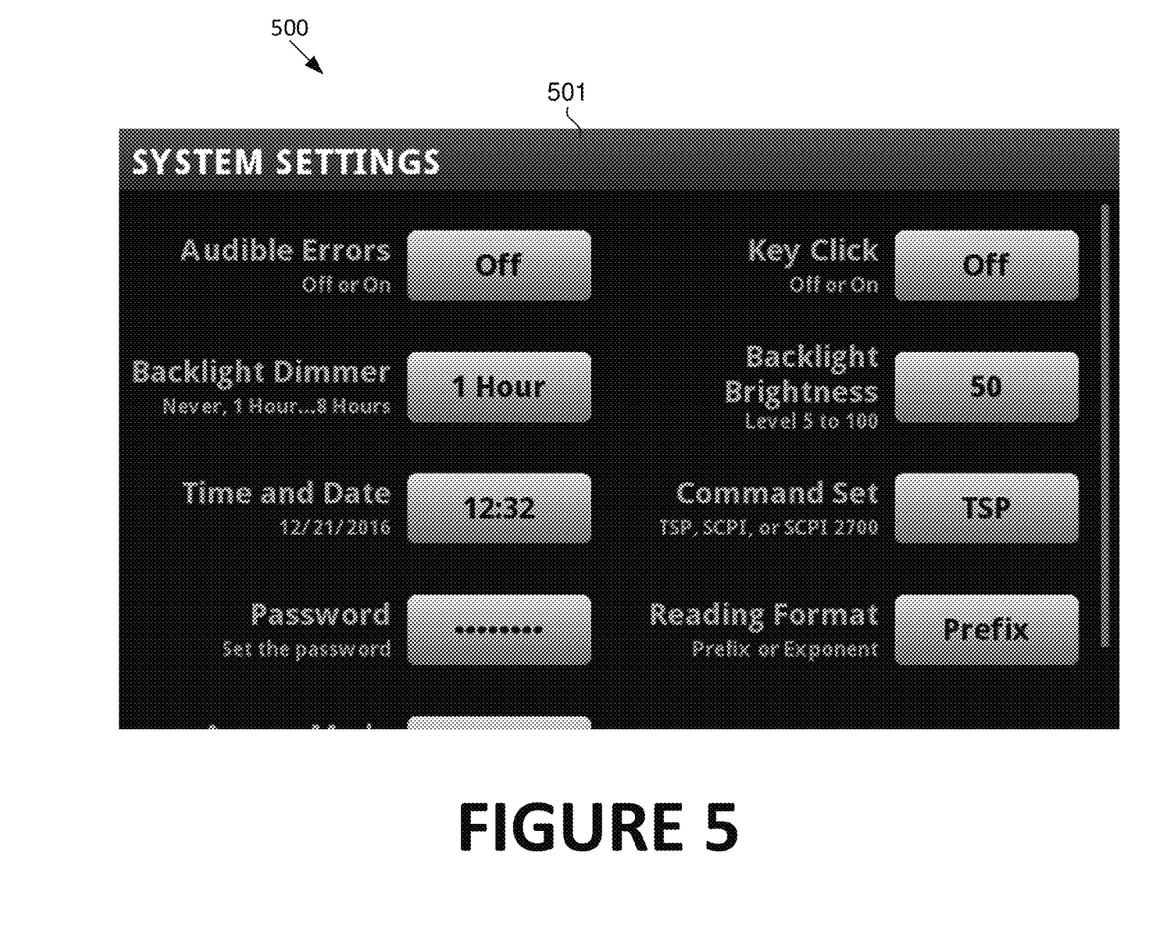
FIG. 5 illustrates an example of a user interface corresponding to an originally-installed application running on an electronic device in accordance with certain implementations of the disclosed technology.

FIG. 5 illustrates an example of a user interface 500 corresponding to a later-installed and approved application running on an electronic device in accordance with certain implementations of the disclosed technology. In the example, the user interface 500 includes an application title bar 501 having a blue background, such as the title bar 200 of FIG. 2, to indicate that the application is an originally-installed application such as factory-installed firmware or a manufacturer-provided application from an application store, for example.

Figure 6:
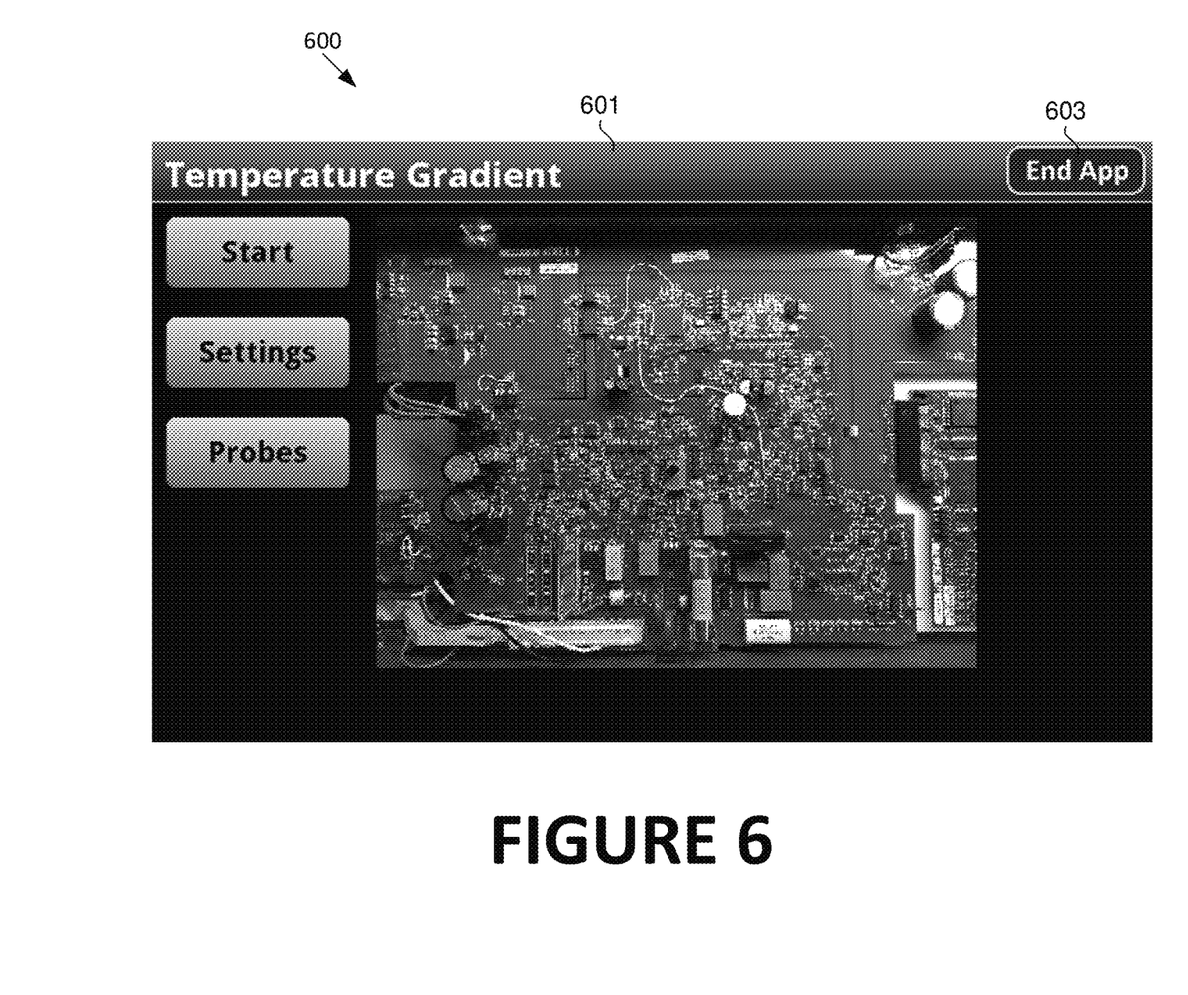
FIG. 6 illustrates an example of a user interface corresponding to a later-installed application running on an electronic device in accordance with certain implementations of the disclosed technology.

FIG. 6 illustrates an example of a user interface 600 corresponding to a later-installed and approved application running on an electronic device in accordance with certain implementations of the disclosed technology. In the example, the user interface 600 includes an application title bar 601 having an orange background, such as the title bar 300 of FIG. 3, to indicate that the application is a later-installed and approved application. In the example, the title bar 600 also includes an Exit App or End App icon 601, e.g., to enable the user and/or technician to quickly and easily cause the application to stop running to diagnose the device, for example.

Certain implementations may enable users, such as customers, to override native keys such that an application can create its own HOME and MENU screens, for example. When a user pushes those keys, the device will now go to the version defined by the application instead of the native firmware's home/menu screen. The corresponding application title bar advantageously enables a user to quickly identify that the application is not an originally-installed application.

Implementations of the disclosed technology may advantageously enable users, such as support personnel, customers trying to assist colleagues using the equipment, etc. to quickly differentiate whether a custom application is involved in a reported problem, for example. A customer may not know or communicate that the symptom(s) he or she is experiencing with the device apply when a non-originally-installed application is running. The provided visual distinction makes it possible for the customer to tell quickly from a screen capture such information so that the problem is investigated in the right context. The customer may also take a photo of the screen to provide to a remote user, such as a technician, so that the remote user can make a diagnosis without needing to physically travel to the device.

EXAMPLES

Illustrative examples of the technologies disclosed herein are provided below. An embodiment of the technologies may include any one or more, and any combination of, the examples described below.

Example 1 includes an electronic device for running a first application, the electronic device comprising a display configured to visually present a user interface, the user interface corresponding to the first application; and a processor configured to determine whether the first application is an originally-installed application and, responsive to a determination that the first application is not an originally-installed application, cause the display to include a visually identifiable feature in the user interface, the visually identifiable feature indicating that the first application is not an originally-installed application.

Example 2 includes the electronic device of Example 1, or any other example device described herein, in which the user interface includes a title bar having a color.

Example 3 includes the electronic device of Example 2, or any other example device described herein, in which the visually identifiable feature includes a change to the color of the title bar.

Example 4 includes the electronic device of Example 2, or any other example device described herein, in which the processor is further configured to cause the display to include another visually identifiable feature corresponding to the first application.

Example 5 includes the electronic device of any of Examples 1-4, or any other example device described herein, in which the processor is further configured to determine whether the first application is an approved application.

Example 6 includes the electronic device of Example 5, or any other example device described herein, in which the processor is further configured to cause the display to include another visually identifiable feature corresponding to the first application responsive to a determination that the application is an approved application, the other visually identifiable feature indicating that the first application is an approved application.

Example 7 includes the electronic device of Example 6, or any other example device described herein, in which the other visually identifiable feature is an icon.

Example 8 includes the electronic device of any of Examples 1-7, or any other example device described herein, further including a physical component configured to indicate that the application is not an originally-installed application.

Example 9 includes the electronic device of Example 8, or any other example device described herein, in which the physical component is a light-emitting diode (LED).

Example 10 includes the electronic device of Example 5, or any other example device described herein, further including a physical component configured to indicate that the application is an approved application responsive to a determination that the application is an approved application.

Example 11 includes the electronic device of Example 10, or any other example device described herein, in which the physical component is a light-emitting diode (LED).

Example 12 includes the electronic device of any of Examples 1-11, or any other example device described herein, in which the electronic device is a test and measurement instrument.

Example 13 includes the electronic device of any of Examples 1-12, or any other example device described herein, in which the user interface includes text having a font, a color, and a placement.

Example 14 includes the electronic device of Example 13, or any other example device described herein, in which the visually identifiable feature includes a change to the color of the text.

Example 15 includes the electronic device of Example 13, or any other example device described herein, in which the visually identifiable feature includes a change to the font of the text.

Example 16 includes the electronic device of Example 13, or any other example device described herein, in which the visually identifiable feature includes a change to the placement of the text.

Example 17 includes a method comprising visually presenting a user interface corresponding to an application running on an electronic device; determining whether the application is an originally-installed application; and responsive to a determination that the application is not an originally-installed application, causing the user interface to include a visually identifiable feature indicating that the application is not an originally installed application.

Example 18 includes the method of Example 17, or any other example method described herein, in which causing the user interface to include a visually identifiable feature includes at least one selected from a group consisting of: changing a color of a title bar corresponding to the application, changing a color of text corresponding to the application, changing a font of the text, changing a placement of the text, and visually presenting an icon.

Example 19 includes the method of Example 17, or any other example method described herein, further comprising determining whether the application is an approved application; and responsive to a determination that the application is an approved application, causing the user interface to include another visually identifiable feature indicating that the application is an approved application.

Example 20 includes the method of Example 17, or any other example method described herein, further comprising causing a physical component to indicate that the application is not an originally-installed application.

Implementations of the disclosed technology may serve to effectively protect the device manufacturer's brand without overly restricting the customer's ability to make their own customizations. Other advantages include quality control without compromising speed such that customers can make customizations quickly without the roadblocks they may presently experience.

Having described and illustrated the principles of the invention with reference to illustrated embodiments, it will be recognized that the illustrated embodiments may be modified in arrangement and detail without departing from such principles, and may be combined in any desired manner. And although the foregoing discussion has focused on particular embodiments, other configurations are contemplated.

In particular, even though expressions such as "according to an embodiment of the invention" or the like are used herein, these phrases are meant to generally reference embodiment possibilities, and are not intended to limit the invention to particular embodiment configurations. As used herein, these terms may reference the same or different embodiments that are combinable into other embodiments.

Consequently, in view of the wide variety of permutations to the embodiments described herein, this detailed description and accompanying material is intended to be illustrative only, and should not be taken as limiting the scope of the invention. What is claimed as the invention, therefore, is all such modifications as may come within the scope and spirit of the following claims and equivalents thereto.

The invention claimed is:

1. An electronic device for running an installed application, the electronic device comprising:
   a display configured to visually present a user interface, the user interface corresponding to the installed application; and
   a processor configured to:
      determine whether the installed application is an originally-installed application, and
      responsive to a determination that the installed application is not an originally-installed application, cause the display to include a visually identifiable feature in the user interface, the visually identifiable feature indicating that the installed application is not an originally-installed application, and determine whether the installed application is an approved application and, responsive to the determination that the installed application is an approved application, further cause the display to include another visually identifiable feature corresponding to the installed application, the other visually identifiable feature indicating that the installed application is an approved application.

2. The electronic device of claim 1, wherein the user interface includes a title bar having a color.

3. The electronic device of claim 2, wherein the visually identifiable feature includes a change to the color of the title bar.

4. The electronic device of claim 2, wherein the processor is further configured to cause the display to include another visually identifiable feature corresponding to the installed application.

5. The electronic device of claim 1, wherein the other visually identifiable feature is an icon.

6. The electronic device of claim 1, further including a physical component configured to indicate that the installed application is not an originally-installed application.

7. The electronic device of claim 6, wherein the physical component is a light-emitting diode (LED).

8. The electronic device of claim 1, further including a physical component configured to indicate that the installed application is an approved application responsive to a determination that the installed application is an approved application.

9. The electronic device of claim 8, wherein the physical component is a light-emitting diode (LED).

10. The electronic device of claim 1, wherein the electronic device is a test and measurement instrument.

11. The electronic device of claim 1, wherein the user interface includes text having a font, a color, and a placement.

12. The electronic device of claim 11, wherein the visually identifiable feature includes a change to the color of the text.

13. The electronic device of claim 11, wherein the visually identifiable feature includes a change to the font of the text.

14. The electronic device of claim 11, wherein the visually identifiable feature includes a change to the placement of the text.

15. A method, comprising:
   visually presenting a user interface corresponding to an installed application running on an electronic device;
   determining whether the installed application is an originally-installed application;
   responsive to a determination that the installed application is not an originally-installed application, causing the user interface to include a visually identifiable feature indicating that the installed application is not an originally-installed application;
   determining whether the installed application is an approved application; and
   responsive to a determination that the installed application is an approved application, causing the user interface to include another visually identifiable feature indicating that the installed application is an approved application.

16. The method of claim 15, wherein causing the user interface to include a visually identifiable feature includes at least one selected from a group consisting of: changing a color of a title bar corresponding to the installed application, changing a color of text corresponding to the installed application, changing a font of the text, changing a placement of the text, and visually presenting an icon.

17. The method of claim 15, further comprising causing a physical component to indicate that the installed application is not an originally-installed application.

* * * * *